United States Patent
Hirler et al.

(10) Patent No.: US 8,389,362 B2
(45) Date of Patent: Mar. 5, 2013

(54) SEMICONDUCTOR COMPONENT WITH CELL STRUCTURE AND METHOD FOR PRODUCING THE SAME

(75) Inventors: Franz Hirler, Isen (DE); Oliver Haeberlen, Villach (AT); Walter Rieger, Arnoldstein (AT)

(73) Assignee: Infineon Technologies Austria AG, Villach (AT)

( * ) Notice: Subject to any disclaimer, the term of this patent is extended or adjusted under 35 U.S.C. 154(b) by 0 days.

(21) Appl. No.: 13/268,097

(22) Filed: Oct. 7, 2011

(65) Prior Publication Data

US 2012/0028417 A1 Feb. 2, 2012

Related U.S. Application Data (62) Division of application No. 12/032,725, filed on Feb. 18, 2008, now Pat. No. 8,067,796.

(30) Foreign Application Priority Data

Feb. 20, 2007 (DE) .......................... 10 2007 008 777

(51) Int. Cl.
*H01L 21/8236* (2006.01)
(52) U.S. Cl. ....................................... 438/268; 438/273
(58) Field of Classification Search .................. 438/268, 438/273, 274, 281, 212, 286, 341, 197, 198, 438/199, 202; 257/343–347, E27.056, E27.057, 257/E27.096, E27.126, E29.118, E29.131, 257/E29.122, E21.141, E21.629, E29.274
See application file for complete search history.

(56) References Cited

U.S. PATENT DOCUMENTS

| | | | |
|---|---|---|---|
| 6,414,404 B1 | 7/2002 | Allen | |
| 6,870,201 B1 | 3/2005 | Deboy et al. | |
| 7,619,280 B2 * | 11/2009 | Cao et al. | 257/330 |
| 2001/0023957 A1 | 9/2001 | Warwick | |
| 2002/0081769 A1 * | 6/2002 | Tani et al. | 438/106 |
| 2002/0100951 A1 * | 8/2002 | Yasuhara et al. | 257/491 |
| 2002/0142548 A1 * | 10/2002 | Takaishi | 438/270 |
| 2003/0178676 A1 | 9/2003 | Henninger et al. | |
| 2003/0222297 A1 | 12/2003 | Krumrey et al. | |
| 2004/0188775 A1 * | 9/2004 | Peake et al. | 257/397 |
| 2005/0017291 A1 | 1/2005 | Hirler | |
| 2005/0133855 A1 * | 6/2005 | Graf | 257/327 |
| 2006/0027917 A1 * | 2/2006 | Wachter | 257/728 |
| 2006/0035441 A1 * | 2/2006 | Rieger | 438/459 |
| 2006/0124995 A1 | 6/2006 | Ninomiya et al. | |
| 2006/0273351 A1 * | 12/2006 | Ozoe et al. | 257/220 |
| 2006/0273385 A1 | 12/2006 | Hshieh | |
| 2007/0004116 A1 * | 1/2007 | Hshieh | 438/197 |
| 2007/0210410 A1 | 9/2007 | Hirler et al. | |
| 2008/0067584 A1 | 3/2008 | Lui et al. | |

* cited by examiner

*Primary Examiner* — Cuong Q Nguyen
*Assistant Examiner* — Yosef Gebreyesus
(74) *Attorney, Agent, or Firm* — Dicke, Billig & Czaja, PLLC (57) ABSTRACT

A semiconductor component comprises a semiconductor body comprising a first component electrode arranged on one of the surfaces of the semiconductor body, a second component electrode arranged on one of the surfaces of the semiconductor body, and a component control electrode arranged on one of the surfaces of the semiconductor body. In this case, active semiconductor element cells are arranged in a first active cell array of the semiconductor body, the semiconductor element cells comprising a first cell electrode, a second cell electrode and a cell control electrode and also a drift path between the cell electrodes. At least the component control electrode is arranged on a partial region of the semiconductor body and a second active cell array is additionally situated in the partial region of the semiconductor body below the component control electrode.

12 Claims, 8 Drawing Sheets

SEMICONDUCTOR COMPONENT WITH CELL STRUCTURE AND METHOD FOR PRODUCING THE SAME

CROSS-REFERENCE TO RELATED APPLICATIONS

This Utility patent application is a divisional of U.S. application Ser. No. 12/032,725, filed Feb. 18, 2008, which claims benefit of German Patent Application No. DE 10 2007 008 777.4, filed Feb. 20, 2007, incorporated herein.

BACKGROUND

This disclosure relates to a semiconductor component with cell structure and a method for producing the same. The semiconductor component includes a semiconductor body including a first component electrode arranged on one of the surfaces of the semiconductor body, a second component electrode arranged on one of the surfaces of the semiconductor body, and a component control electrode arranged on one of the surfaces of the semiconductor body. In this case, active semiconductor element cells are arranged in an active cell array of the semiconductor body, the semiconductor element cells including a first cell electrode, a second cell electrode and a cell control electrode and also a drift path between the cell electrodes. At least the component control electrode is arranged on a partial region of the semiconductor body.

A semiconductor component of this type is also referred to as a transistor arrangement with a structure for electrical contact-connection. The transistor arrangement has for example a source terminal as first component electrode, for example a drain terminal as second component electrode and for example a gate terminal as component control electrode. The semiconductor body of a transistor arrangement of this type is formed by a semiconductor substrate with an active cell array. The transistor arrangement or a semiconductor component of this type also has a partial region.

One disadvantage of semiconductor components of this type is that in the partial region or in the region of the gate terminal, the transistor arrangement is not active and therefore does not contribute to the current flow in the switched-on state or to reducing the on resistance $R_{on}$. In particular, the source region is omitted in the partial region in order to ensure the required robustness of the transistor arrangement. This appears to be necessary since in the case of an n-channel transistor for example holes which arise at the body zone flow through the relatively high-resistance body zone and thus cause a voltage drop in the body zone, the voltage drop being all the greater, the longer the distance to the nearest body contact.

Consequently, if a source zone lies in the body zone, then the base of a parasitic npn bipolar transistor is thereby biased and the transistor arrangement can be switched on even in the case of small currents, which can generally lead to destruction of the transistor arrangement on account of the splitting of the avalanche effects.

Since, in the partial region, the monolayer metallization used in power transistors does not enable the body zones to be contact-connected with the aid of the source metallization, these regions which are connected to the source metallization must remain free of source zones. This is particularly applicable to semiconductor components with trench structures having a plurality of electrodes, for which the space requirement is very large since all the electrodes in the partial region have to be led upwards and connected. For this purpose, the electrodes situated at a deeper level have to be connected further outwards in the partial region than electrodes situated at a higher level especially as the electrode situated at a higher level must otherwise be interrupted for the connection of an electrode situated at a deeper level.

For these and other reasons, there is a need for the present invention.

SUMMARY

One embodiment of the invention provides a semiconductor component including a semiconductor body. A first component electrode is arranged on one of the surfaces of the semiconductor body, a second component electrode is arranged on one of the surfaces of the semiconductor body, a component control electrode is arranged on one of the surfaces of the semiconductor body, and active semiconductor element cells are arranged in a first active cell array of the semiconductor body. The semiconductor element cells include a first cell electrode, a second cell electrode and a cell control electrode and also a drift path between the cell electrodes, wherein at least one second active cell array is arranged in a partial region of the semiconductor body on which at least the component control electrode is arranged, below the component control electrode.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

DETAILED DESCRIPTION

In the following Detailed Description, reference is made to the accompanying drawings, which form a part hereof, and in which is illustrated by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Figure 1:
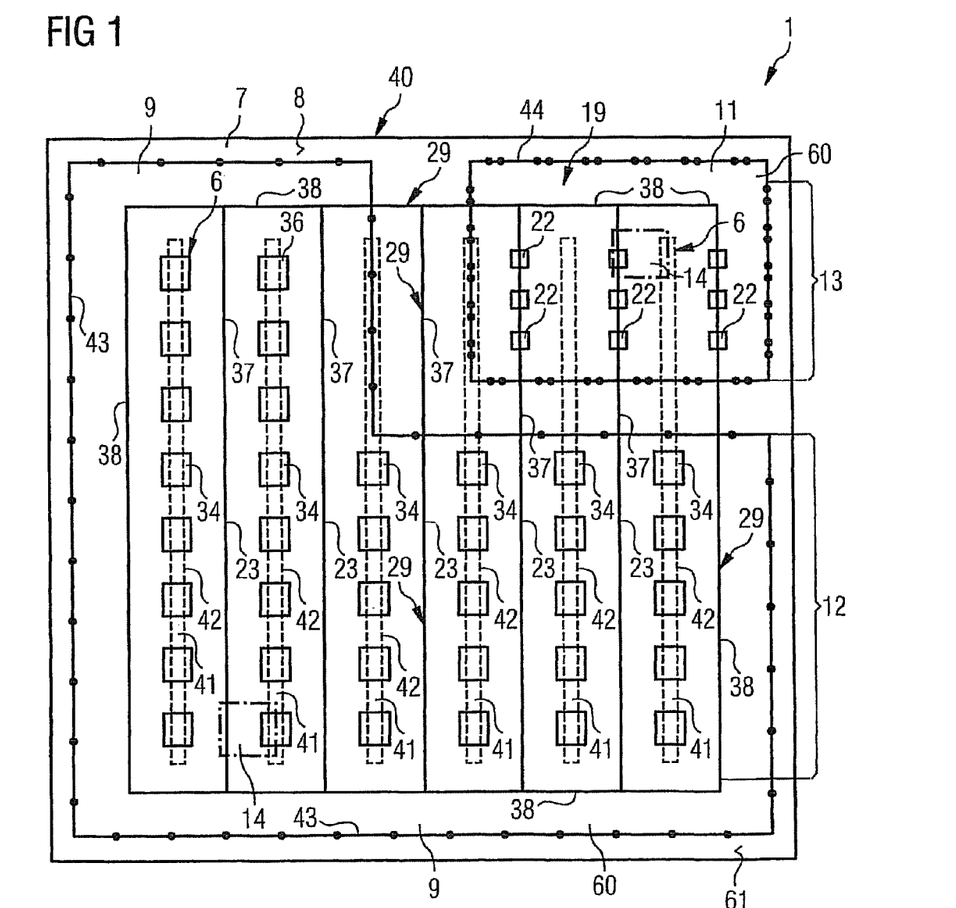
FIG. 1 illustrates a schematic plan view of a semiconductor component of one embodiment of the invention.

FIG. 1 illustrates a schematic plan view of a semiconductor component 1 of one embodiment of the invention. The semiconductor component 1 has a semiconductor body 7, which was separated from a monocrystalline semiconductor wafer. The surface 8 of the semiconductor body 7 is covered by a first component electrode 9, the contour of which is identified by a dotted line 43 and which can have a metallization having a thickness of between 3 µm and 5 µm through to 20 µm, for example. Arranged below the metallization is a central first cell array 12, which includes a multiplicity of active semiconductor element cells 14 which are in contact with one another via strips 41, the contour of which is illustrated by dashed lines 42.

In the case of this MOSFET transistor, the first component electrode 9 formed from the metallization is a source electrode, which is electrically connected via through contacts 34 in the windows 36 to strips 41 arranged below the through contacts 34, the strips in turn being electrically connected to source zones arranged underneath and to body zones surrounding the latter. Consequently, the strips 41 form the source/body contacts to the respective first cell electrodes of the central first cell array 12. The strips 41 are filled for example with titanium silicides, titanium nitride, tungsten and/or polysilicon and lead through an intermediate insulation layer 35 between the metallization illustrated here in the form of the first component electrode 9 and the underlying first cell array 12 arranged centrally.

Made from the material of the metallization there is also a component control electrode 11 arranged in the partial region 19 of the semiconductor body 7, the contour of the electrode being identified by a double-dotted line 44. A second active cell array 13 having a plurality of semiconductor element cells 14 is arranged below the component control electrode 11, which is also called gate electrode in the case of a MOSFET. In this case, the through contacts 22 in the windows 36 which extend through an insulation layer between the metallization and the surface 8 of the semiconductor body represent through contacts 22 to trench gate electrodes forming the cell control electrodes. The trench structure for the trench gate electrodes or cell control electrodes are represented by a solid line and form a line ring 38 around the active region both of the centrally arranged first cell array 12 and of the second cell array 13 of the partial region and represent cell control connecting lines 23 for the numerous semiconductor element cells 14. The second component electrode, which is a drain electrode in this case, is situated on the rear side of the semiconductor chip 45 illustrated here and is therefore not visible.

With this semiconductor component 1, the surface regions of the semiconductor body 7 which are not covered by the metallization 60 for the first component electrode 9 can nevertheless utilize body contacts for an active second cell array 13 below the component control electrode 11 by virtue of the fact that the body zones now provided there, with a further thinner metallization layer or other low-resistance interlayers such as e.g., highly doped polysilicon or highly doped diffusion regions, are connected to the body zones in the central first cell array 12 or the metallization 60 of the first component electrode 9, which is at a potential of the first component electrode 9.

Moreover, it is possible to arrange the cell control electrodes in trench structures 29 and to connect them to the component control electrode 11 via a further highly conductive layer below the metallization 60. In this case, the highly conductive layer should have a width of less than 1 µm in order that the body contacts to the body zone are not spaced apart too far from one another and in order that a high avalanche strength is thus ensured for the new semiconductor component. This embodiment of the invention provides a width b for the further highly conductive layer below the metallization 60 of a width b where b≦0.5 µm. Consequently, the active second cell array 13 in the partial region below the component control electrode 11 is electrically connected to the centrally arranged active first cell array 12 via an additionally electrically conductive intermediate metallization structure.

It is furthermore provided that at least the first cell electrode of the centrally arranged first cell array 12 is electrically connected to the first component electrode 9 via through contacts 34 through a central insulation layer. By optimizing the through contact structure, it is thus ensured that both a central first cell array 12 and a second cell array 13 arranged in the partial region, below the component control electrode 11, are fully functional.

It is furthermore provided that the cell control electrodes of the centrally arranged first cell array 12 are electrically connected via interconnects 23 or a ring line 38 to the component control electrode 11 on the partial region 19 of the semiconductor body 7. For this purpose, the interconnects 23 or else the ring line 38 can be arranged in a trench structure 29 which partly forms the cell control electrode. It is only if interconnects 23 or ring line 38 in the trench structure 29 reach or reaches the partial region above which the component control electrode 11 is situated that a connection to the component control electrode 11 is ensured via through contacts 22.

Figure 2:
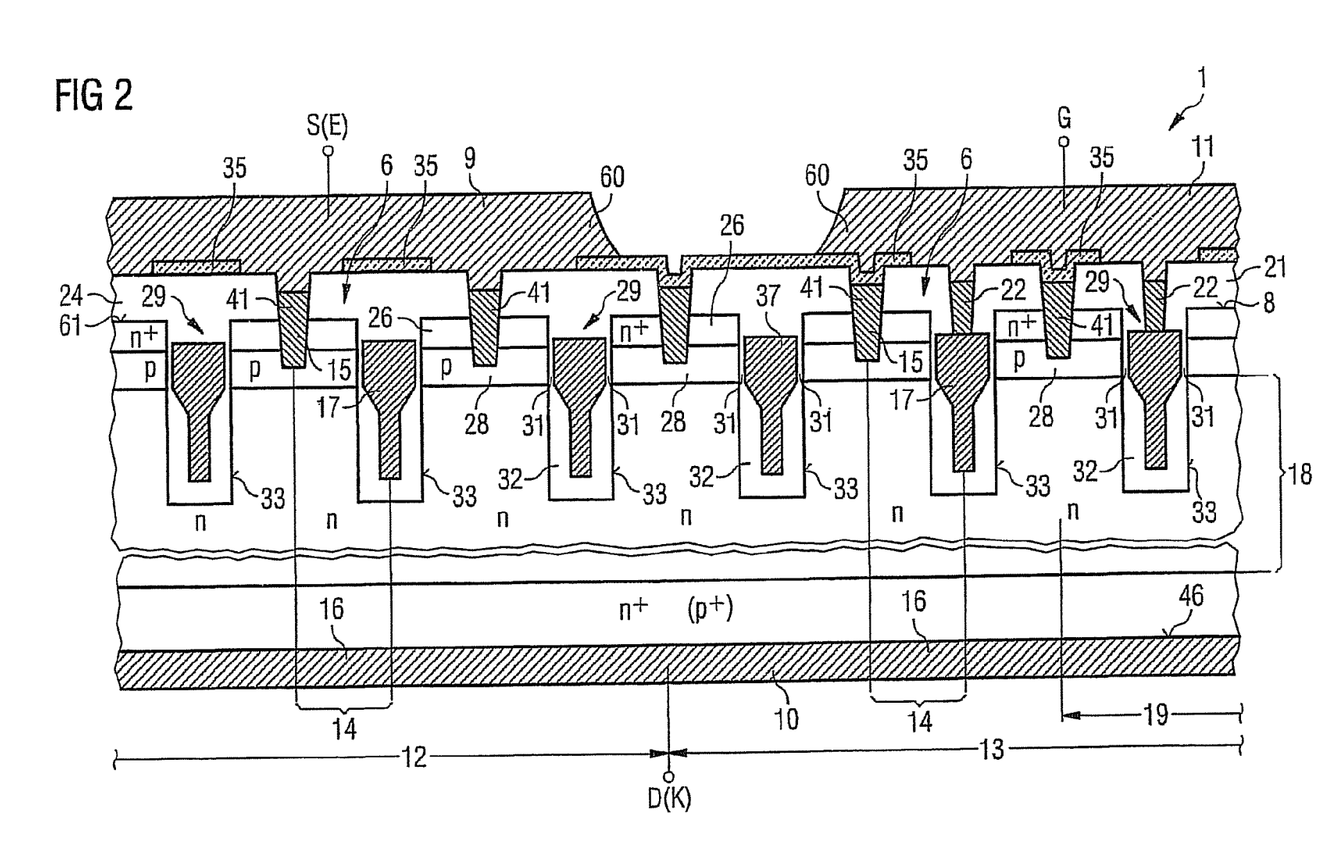
FIG. 2 illustrates a schematic cross section through the semiconductor component in accordance with FIG. 1.

FIG. 2 illustrates a schematic cross section through the semiconductor component 1 in accordance with FIG. 1. In this case, the left-hand side of FIG. 2 illustrates a cross section through the centrally arranged first cell array 12, which is arranged below the metallization 60 for the source electrode S, and the right-hand side of FIG. 2 illustrates the cross section through the second cell array 13 of the partial region, the second cell array being covered by a metallization 60 for a component control electrode 11. A second component electrode 10 covers the rear side 46 of the semiconductor body. In the case of a MOSFET having a vertical drift path 18, the first component electrode 9 is a source electrode S arranged on the top side 61 of the semiconductor body 7 and the second component electrode 10 is a drain electrode D situated on the rear side 46 of the semiconductor body.

The component control electrode 11 is arranged jointly with the first component electrode 9 on the top side 61 of the semiconductor body 7 and forms a gate electrode G. In the case of an IGBT, the first component electrode 9 is an emitter electrode E and the second component electrode 10 is a collector electrode K and the component control electrode 11 is an insulated gate electrode G. In the case of the IGBT, the second component electrode 10 makes contact with a highly doped region of the semiconductor body 7 that conducts complementarily with respect to the drift path.

Arranged both in the central first cell array 12 and in the second cell array 13 of the partial region are identically constructed semiconductor element cells 14 having a first cell electrode 15, which makes contact with a source or emitter zone 26 and a body zone 28. Furthermore, the semiconductor component cell 14 of the cell arrays 12 and 13 has a second cell electrode 16, which, in the case of the vertical orientation of a drift path 18 illustrated here, is arranged on the rear side 46 of the semiconductor body 7 and occupies a partial region of the large-area second component electrode 10. Furthermore, the semiconductor element cell 14 has a cell control electrode 17, which, in this embodiment of the invention, forms a trench gate electrode 37 arranged in a trench structure 29 of the semiconductor body 7. In this embodiment of the invention, the trench structure 29 has a trench wall 33 coated with a thin gate oxide layer 31 in the region of the body zone 28, such that a control action can proceed from the cell control electrode 17, the lower region of the trench structure 29 having a thicker insulation layer 32 of the trench walls 33 than the gate oxide layer 31 since no switching function is provided in the lower region.

The difference between the central first cell array 12 below the first component electrode 9 and the second cell array 13 in the partial region below the component control electrode 11 consists, then, in the fact that the first component electrode 9, via through contacts 34 having a contact filling composed of titanium silicide, titanium nitride, tungsten or polysilicon, makes contact directly with the adjacent source or emitter zones 26 and the body zone 28, while in the partial region the component control electrode 11 is insulated from the through contacts 34 by a thin insulation layer 35 and in return has through contacts 22 to the cell control electrodes 17. As illustrated by the plan view of the semiconductor component 1 in FIG. 1, the cell control electrodes 17 are connected to one another via a trench structure 29 arranged in ring-shaped fashion, the trench structure being designated as ring line 38, the cell control connecting lines 23, which are visible in FIG. 1, practically forming the cell control electrodes 17 which are arranged in a trench structure 29 and are illustrated in FIG. 2. A thin further insulation layer 35 insulates the through contacts 34 to the source and body zones 26 and 28, respectively, below the component control electrode 11 from the control potential applied to the first component control electrode 9.

Since the component control electrode 11 is provided in the partial region, the through contacts 22 through an additional insulation layer are provided there in order to electrically connect the cell control electrodes 17 of the active cell array 13 of the partial region to the component control electrode 11. It is also possible for a plurality of further second active cell arrays to be provided in the partial region, the cell arrays being electrically insulated from the component electrode 11 arranged in the partial region by an additional insulation layer. The cell control electrodes 17 of the active second cell arrays 13 in the partial region are electrically connected via through contacts 22 through the insulation layer to the component control electrode 11 situated on the top side of the semiconductor component 1. The through contacts 22 form a plug structure which, in the central first cell array 12, connects a component electrode 9 to the first cell electrodes 15, which simultaneously makes contact with the associated body zones 28 surrounding the cell electrodes 15.

Even though FIGS. 1 and 2 illustrate semiconductor components 1 having vertical drift paths 18, the invention is nevertheless not limited to these embodiments and can also be provided for a semiconductor component having a laterally oriented drift path 18, wherein the first and second component electrodes 9 and 10 and also the component control electrode 11 are arranged on a common surface 61 of the semiconductor body 7. Both the first and the second semiconductor component electrodes 9 and 10 and the component control electrode 11 can be produced from the material of the metallization 60, such that the metallization 60 simultaneously represents a metallization for bonding connecting elements and/or clip connecting elements and/or bonding strip elements.

If the semiconductor component 1, as illustrated in FIGS. 1 and 2, has a vertically oriented drift path 18, then the component electrodes 9 and 10 are arranged on opposite surfaces 8 of the semiconductor body 7. While the component control electrode 11 is arranged jointly with the first component electrode 9 on a surface 61, the second component electrode 10 is situated on the rear side 46 of the semiconductor body 7. For such semiconductor components 1 having a vertically oriented drift path 18 it is to provide second active cell arrays 13 below the component control electrode 11.

In this way the first cell electrode 15 can be a highly doped source zone 26—near the surface—of a MOSFET or a highly doped emitter zone—near the surface—of an IGBT, which have the same conduction type as the drift path 18. Furthermore, in a MOSFET or IGBT of this type, the source zone 26 or the emitter zone is surrounded by a body zone 28 which is doped complementarily to the drift path and which is operatively connected to a cell control electrode 17, such that when a corresponding control voltage is applied to the cell control electrode 17, via the component control electrode 9, the corresponding semiconductor component cells 14 both in the central first cell array 12 and in the second cell array 13 of the partial region activate the entire semiconductor component 1. In this case a channel forms through the body zone 28 towards the drift path 18.

The cell control electrodes 17 in the central first active cell array 12 are arranged in trench structures 29, wherein the trench structures 29 extend right into the second active cell array 13 of the partial region. It is thus possible, without additionally surface-mounted interconnects, to provide a connecting structure which the cell control electrodes 17 in the trench structures 29 simultaneously also use as interconnects 23 or as ring lines 38.

In the trench structure 29 it is provided that a gate oxide layer 31 is arranged between the cell control electrodes 17 and the body zones 28, the gate oxide layer, in the case of such trench gate structures 37 in which the cell control electrodes 17 are arranged in the trench structure 29, being formed by an insulation layer on the trench walls 33. In this case, the layer thickness of the insulation layer in the trench structure can increase on the trench walls 33 as soon as a gate oxide layer function is no longer necessary, and form the insulation layer 32 illustrated in FIG. 2.

A plurality of gate electrodes can also be arranged one above another or alongside one another in the trench structure 29 for the cell control electrodes 17, the gate electrodes being connected to the potential of the first electrode 9 or different potentials. Furthermore, it is possible for the semiconductor component 1 to have a through contact structure within the trench structure 29, which electrically connects the first component electrode 9 to the body zones 28 of the central first cell array 12. For this purpose, the through contacts 34 to the first component electrode 9 can be surrounded by an insulating barrier in the trench structure 29 and have a filling with tungsten or a metallic contact layer to the body contact with a filling composed of highly doped polysilicon.

The semiconductor component 1 can also be combined with an active zenering. For this purpose, a zener diode is connected between the component control electrode 11 and the second component electrode 10 of the semiconductor component 1, which diode opens the cell control electrodes 17 if it lies above a voltage resulting from the zener voltage of the zener diode plus breakdown voltage at the second component electrode 10. It is thereby possible to prevent the semiconductor component 1 from carrying large currents over a relatively long time as a result of avalanche generation. Moreover, larger distances between body contacts are possible in the case of active zenering.

As already mentioned above, the through contacts 34 can be used when contact trenches are additionally provided, since both the source zone 26 and the body zone 28 can thereby be locally connected to one another. In this case, the through contacts 34 typically have the abovementioned barrier and a filling with tungsten or a metallic contact layer at least between an n-poly and the p-type body zone 28 and also a highly doped polysilicon for electrical connection.

Moreover, a thin metallization layer can be used in order, bearing on the silicon surface, to make contact both with the source zone 26 and with the body zone 28. In contrast to the plated-through holes 34, the thin metallization layer can also produce transversely with respect to the trench structures 29 a conductive connection to the metallization 60 arranged above the cell arrays 12 or 13. By way of example, a "seed layer" for an electrodeposition can also be used for this purpose.

The connection of the semiconductor material in the various connection zones can be implemented by highly doped regions. That is fulfilled in any case for the source zone 26 because it usually has a highly doped region near the surface via which a metallic or polysilicon connection can be effected. An additional highly doped region can be introduced into the body zone 28 for contact-connection purposes in the region near the surface or the body contact region is used for this purpose by flat contacts on the silicon surface. As already mentioned above, in the case of a trench structure 29 for a cell control electrode 17, a gate oxide having a homogenous thickness is required on the trench walls 33. However, a significantly thicker oxide layer 32 can be provided outside the region acting as gate electrode, for example in the lower region of the trench structure 29 or in an upper region of the trench structure 29.

If, as mentioned above, a plurality of electrodes are arranged one above another or else alongside one another in the trench structure 29, then the plurality of electrodes can be connected, in the centrally arranged first cell array 12 or in the second cell array 13 of the partial region, to the metallization 60 of the first component electrode 9 or the "source metallization". However, they can also be supplied with other potentials. In the MOSFETs or IGBTs already mentioned above, bipolar transistors or JFETs can also be provided with first cell arrays 12 in a central region and second cell arrays 13 in a partial region, wherein the cell electrodes discussed for MOSFETs then represent base regions of a bipolar transistor or gate zones of a JFET, wherein leads to the regions or zones do not always have to be completely insulated. Moreover, for semiconductor components 1 having a vertical drift path structure, it is customary, as is known, to realize the second component electrode 10 in the form of a drain terminal on the rear side 46 of the semiconductor body 7.

It should nevertheless be noted that the new semiconductor component is not restricted just to trench transistors or strip structures. This is also illustrated in part by the subsequent drawings of the further embodiments of the invention, for example, which illustrate a planar DMOS, for example.

A method for producing a plurality of semiconductor chips 40 for semiconductor components 1 with cell structures 6 involves firstly providing a semiconductor wafer including a monocrystalline semiconductor body 7 with semiconductor element cells 14 for MOSFETs, IGBTs or JFETs with a lateral or vertical drift path 18. The drift path 18 is arranged between a first region—near the surface—of the semiconductor body 7 for a first cell electrode 15 and a second region of the semiconductor body 7 for a second cell electrode 16. In this case, the first region near the surface has a surrounding body zone 28 with semiconductor material doped complementarily to the drift path 18. The body zone 28 can be activated by a cell control electrode 17 in interaction with a component control electrode 11.

After the patterning of a semiconductor wafer in the manner described above, cell structures 6 of this type are arranged in semiconductor chip positions to form a centrally arranged first cell array 12 provided below a first or a second component electrode 9 or 10, respectively. Finally, a further cell structure 6 of this type is produced in parallel in at least one partial region of the semiconductor chip positions to form a second active cell array 13 of the partial region, the array being provided below a component control electrode 11.

This method has the advantage that the essential components for a centrally arranged first cell array 12 and a second cell array 13 arranged in a partial region of the semiconductor body 7 can be implemented in parallel for a plurality of semiconductor chips 40 on a semiconductor wafer. This parallel fabrication enables the costs for the production of semiconductor components 1 of this type to be kept low.

In detail, this method involves firstly introducing into the semiconductor wafer strip-type trench structures 29 at least for cell control electrodes 17 both of the centrally arranged first cell array 12 and of the at least second cell array 13 of the partial region. This is followed by a thermal oxidation of the trench walls 33 of the trench structure 29 for a cell control electrode insulation layer or a gate oxide layer 31. The trench structures 29 are then filled with a conductive material for cell control electrodes 17. Afterwards, a first insulation layer is applied to the semiconductor body 7. Windows 36 are then opened selectively for through contacts 22 through the first insulation layer to the cell control electrodes 17. A selective deposition of cell control connecting lines 23, which are to be connected to a component control electrode 11 via a ring line 38 or a central interconnect, concludes the production of the cell control electrodes 17.

Afterwards, a further insulation layer can be applied selectively to the cell control connecting lines 23. This is followed by selectively opening windows for through contacts 34 through the first insulation layer and the further insulation layer to the source and body zones 26 and 28 of the first cell arrays as body zone contact. There follows a selective application of an intermediate metallization structure for example for coupling the region of the component control electrode 11. Finally, windows 36 are opened selectively for through contacts 22 to the cell control connecting lines in the region of a ring line 38 in the partial region of the semiconductor body 7 or to a central interconnect and to the cell control electrodes 17 in the region of the first component electrode 9 and to the intermediate metallization layer and also to the body zones 28 in the region of the first component electrode 9.

This opening of windows serves to prepare for the application of the one metallization 60 which, via through contacts 34 and 22 to the cell arrays 12 and 13, respectively, has access to the respective assigned cell structure components such as first cell electrode 15 and cell control electrode 17. The selective opening of the windows for the access of the component electrodes 9 and the component control electrodes 11 to the cell arrays 12 and 13 is followed by selectively implementing the metallization 60 for the first or second component electrode 9 or 10 and for the component control electrode 11 and in the process making contact with the first or second cell electrode 15 or 16 and making contact with the cell control electrode 17. The semiconductor wafer is subsequently separated into semiconductor chips 40.

This sequence of the method can be used to effect patterning of a semiconductor wafer including a monocrystalline semiconductor body 7 with cell structures 6 for MOSFETs, IGBTs or JFETs with a lateral or vertical drift path 18 to form semiconductor chips 40.

In order to produce complete semiconductor components 1, however, the semiconductor chips 40 made from a corresponding semiconductor wafer are applied to a component carrier with a plurality of external contacts in a plurality of semiconductor device positions. The component electrodes 9 and 10 of the semiconductor chips 40 and the component control electrode 11 are subsequently connected to contact pads that are electrically connected to the external contacts of the component carrier. This is followed by applying a semiconductor component housing and in the process enclosing the individual semiconductor chips 40 and the connecting elements. Finally, the circuit carrier is then separated into individual semiconductor components 1.

In one exemplary implementation of the method, a plurality of cell control electrodes are introduced alongside one another or one below another in the trench structure 29. The application of insulation materials that is effected after the production of the trench structure 29, and also a selective application of electrically conductive materials can be effected by photolithography. In this case, selective is understood to mean that a sequence of a plurality of photolithography processes with intervening deposition of insulation layers or metal layers and/or polysilicon layers is effected in order to pattern layers of this type. Prior to introducing trench structures 29 for cell control electrodes 17, a patterned masking layer is applied to the semiconductor wafer, the layer for its part having windows in the regions of the trench structures 29 to be formed. The process of introducing trench structures 29 themselves into the windows of the patterned masking layer can be effected by an anisotropic etch. A dry reactive ion etch can be used for this purpose.

An isotropic thermal oxidation of the semiconductor material is carried out for applying an insulating layer on the trench walls 33 of the trench structure 29. This thermal oxide is distinguished by the fact that a gate oxide layer 31 can be formed on the one hand isotropically and on the other hand homogenously on the trench walls 33. Wet-chemical or dry oxidation installations are available for this purpose. The oxidation rate is significantly higher in the wet-chemical oxidation installations than in the dry oxidation installations. The thermal oxidation cannot take effect as insulation interlayers between two metallization structures since an oxidation would attack the metallization. For this purpose, insulation materials from the group $SiO_2$, $Si_3N_4$ or polyimide are applied by physical or chemical vapor deposition.

In order to fill the trench structures 29 for cell control electrodes 17, they are filled with a conductive material, which can be a highly doped electrically conductive polysilicon deposited from the vapor phase. However, chemically deposited or electrodeposited metals are also provided for filling purposes, in which case, however, prior to an electrodeposition on corresponding insulation layers, a "seed layer" is applied with the aid of a sputtering method, for example, in order to produce a surface conductivity for an electrochemical deposition.

An electroless chemical or an electrolytic metal deposition can also be carried out for depositing component electrodes 9 or 10, ring lines 38 and/or interconnects 23. Moreover, provision is made for carrying out a deposition of highly doped polysilicon for a selective deposition of cell control electrode connecting lines.

As an alternative to the production of through contacts 34 or 22 by opening windows and a selective metallization or deposition of polysilicon, it is also possible for a thin strip-type metallization layer to be sputtered onto the silicon surface of the semiconductor body.

Figure 3:
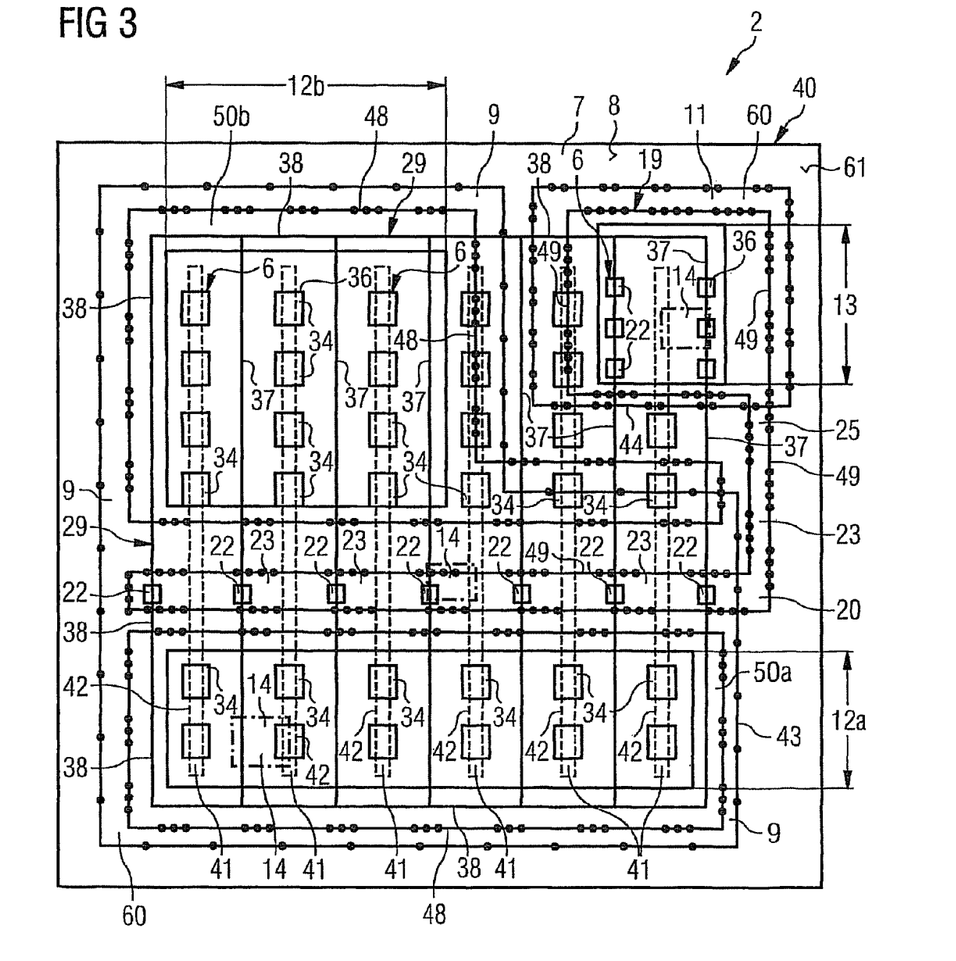
FIG. 3 illustrates a schematic plan view of a semiconductor component of a further embodiment of the invention.

FIG. 3 illustrates a schematic plan view of a semiconductor component 2 of a further embodiment of the invention. Components having the same functions as in FIG. 1 are identified by the same reference symbols and are not discussed separately. In this plan view, the centrally arranged first cell array 12 is divided into two regions 12a and 12b, the contour of the regions being identified by a triple-dotted line 48. The triple-dotted line 48 simultaneously illustrates the contour or the boundaries of an intermediate metallization from which proceed through contacts 34 to the source/body zones, which pervade the semiconductor body 7 in strips 41, the position of the strip-type regions being marked by dashed lines 42.

An intermediate metallization structure 20 is arranged areally between the intermediate metallizations 50a and 50b for the partial regions 12a and 12b of the central first cell array 12, the intermediate metallization structure having an interconnect 23 from which through contacts 22 proceed to the trenches of a strip-type trench gate structure 37 and thus connect the cell control electrodes to the interconnect 23. The interconnect 23 made from an intermediate metallization finally merges into a metallization 60 in the region of the component control electrode 11, such that in the partial region in which the component control electrode 11 is situated, the latter is connected via through contacts 22 of the trench gate trench structure 37.

In regions 12a and 12b of the centrally arranged first cell array 12, these are connected to one another via a common first component electrode 9, an insulating layer (not illustrated here) being arranged between the metallization 60 of the component electrode 9 and the interconnect 23 for the connection to the cell electrodes or to a trench gate structure 37. This is illustrated, however, by subsequent FIGS. 4 and 5, which illustrate cross sections through individual regions of the semiconductor component 2.

The intermediate metallization structure illustrated in FIG. 3, its contour being identified by a quadruple-dotted line 49, has interconnects 23 which electrically connect cell electrodes of the second active cell arrays 13 in the partial region to cell electrodes of the centrally arranged first cell array 12. Consequently, the intermediate metallization structure does not make contact with the metallization 60 of that region of the metallization 60 which is for example at the potential of the first component electrode 9.

In this further embodiment, an intermediate metallization structure already mentioned above connects the source and body zones below the component control electrode 11 in the partial region to the first component electrode 9 above the central first cell array 12. The thickness or width of the intermediate metallization structure has already been thoroughly discussed above, such that a repetition is dispensed with. The intermediate metallization structure in the partial region has a highly doped polysilicon or else a highly doped amorphous silicon. However, it can also include a pure metal layer or a metal alloy layer.

Figure 4:
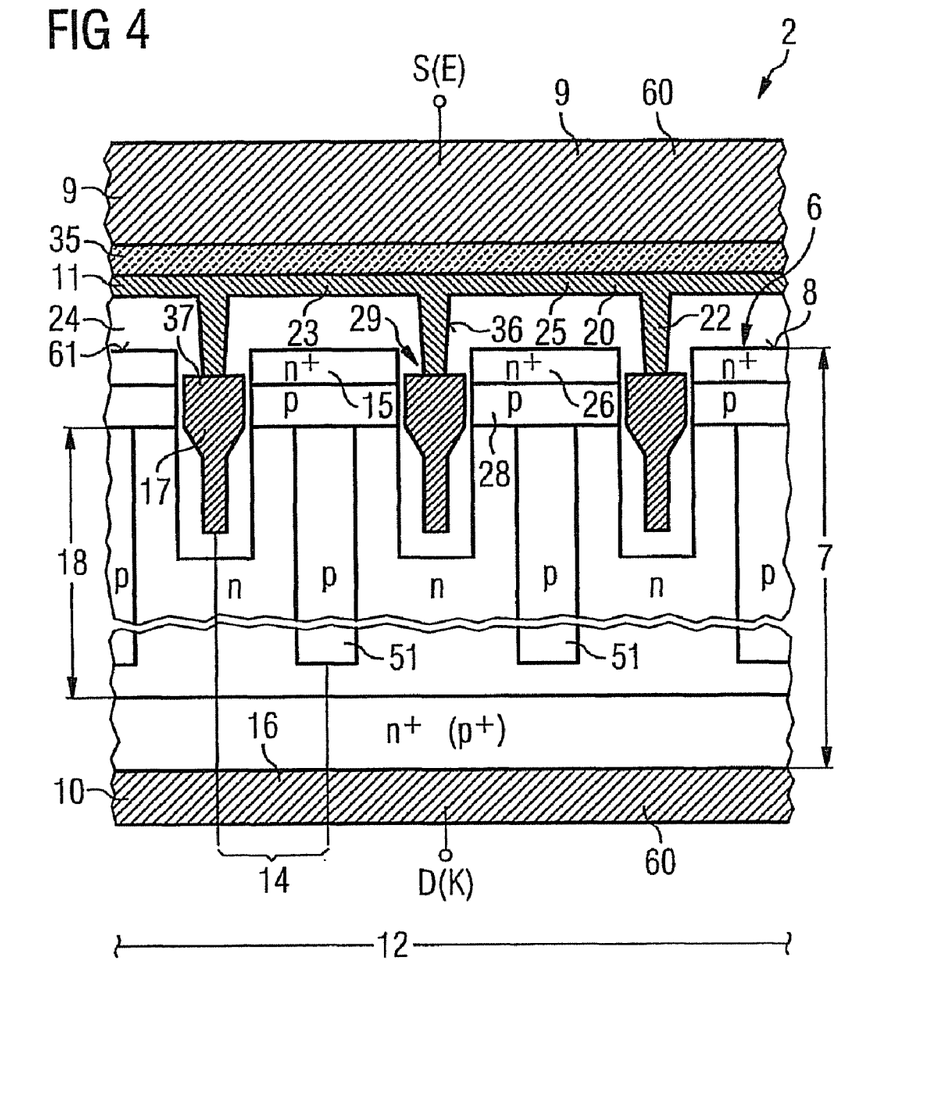
FIG. 4 illustrates a schematic cross section through the semiconductor component in accordance with FIG. 3 through a transition region between two centrally arranged cell arrays.

FIG. 4 illustrates a schematic cross section through the semiconductor component 2 in accordance with FIG. 3 through a centrally arranged first cell array 12 in the transition region between the partial arrays 12a and 12b. Apart from the structure of the drift path, the individual semiconductor element cell 14 is constructed in exactly the same way as in previous FIGS. 1 and 2. The drift path 18 here additionally has charge compensation zones 51 doped complementarily to drift zones 27 of the drift path 18. In addition to this difference from the first embodiment of the invention, the semiconductor component 2 has an intermediate metallization 25 in the transition region from a partial region 12a of the first central cell array to the partial region 12b associated with the central first cell array 12, the intermediate metallization forming an interconnect 23 and, via through contacts 22, connecting the cell control electrodes 17, which are formed as trench gate electrodes 37 here, to the intermediate metallization 25.

In a further embodiment of the invention the drift path 18 has drift zones 27 and charge compensation zones 51 which are doped complementarily to the drift zones 27 and influence the field distribution in the drift zones 27. Instead of charge compensation zones 51 doped complementarily to the drift zones 27, field plates can also be arranged in the drift path 18, the field plates influencing the field distribution in the drift zones 18.

An intermediate metallization structure including a thin metal layer can also bear on the silicon surface of the semiconductor body 7 and connect a source zone 26 or emitter zone and the body zone 28 to one another with high resistance and produce a conductive connection to the first component electrode 9.

Figure 5:
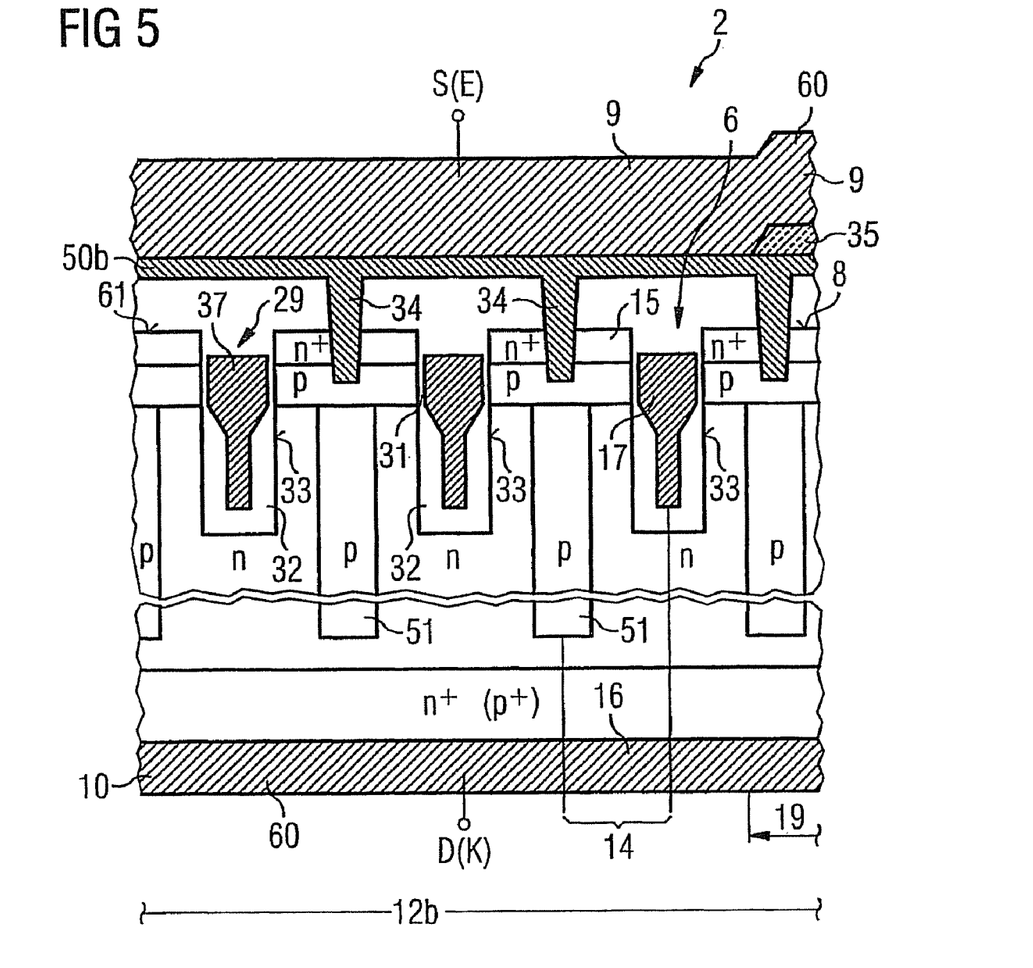
FIG. 5 illustrates a schematic cross section through the semiconductor component in accordance with FIG. 3 through a partial region arranged in the first cell array.

FIG. 5 illustrates a schematic cross section through the semiconductor component 2 in accordance with FIG. 3 through a partial region 12b situated in the centrally arranged first cell array 12. The intermediate metallization 50b arranged in the partial region 12b is in contact via the through contacts 34 with the source zones 26 and the body zones 28 of the individual active semiconductor element cells 14. The metallization 60 of the first component electrode 9 is arranged directly on the intermediate metallization 50b, such that the intermediate metallization 50b and the metallization 60 in the partial region 12b of the central first cell array 12 form a common metallization.

Figure 6:
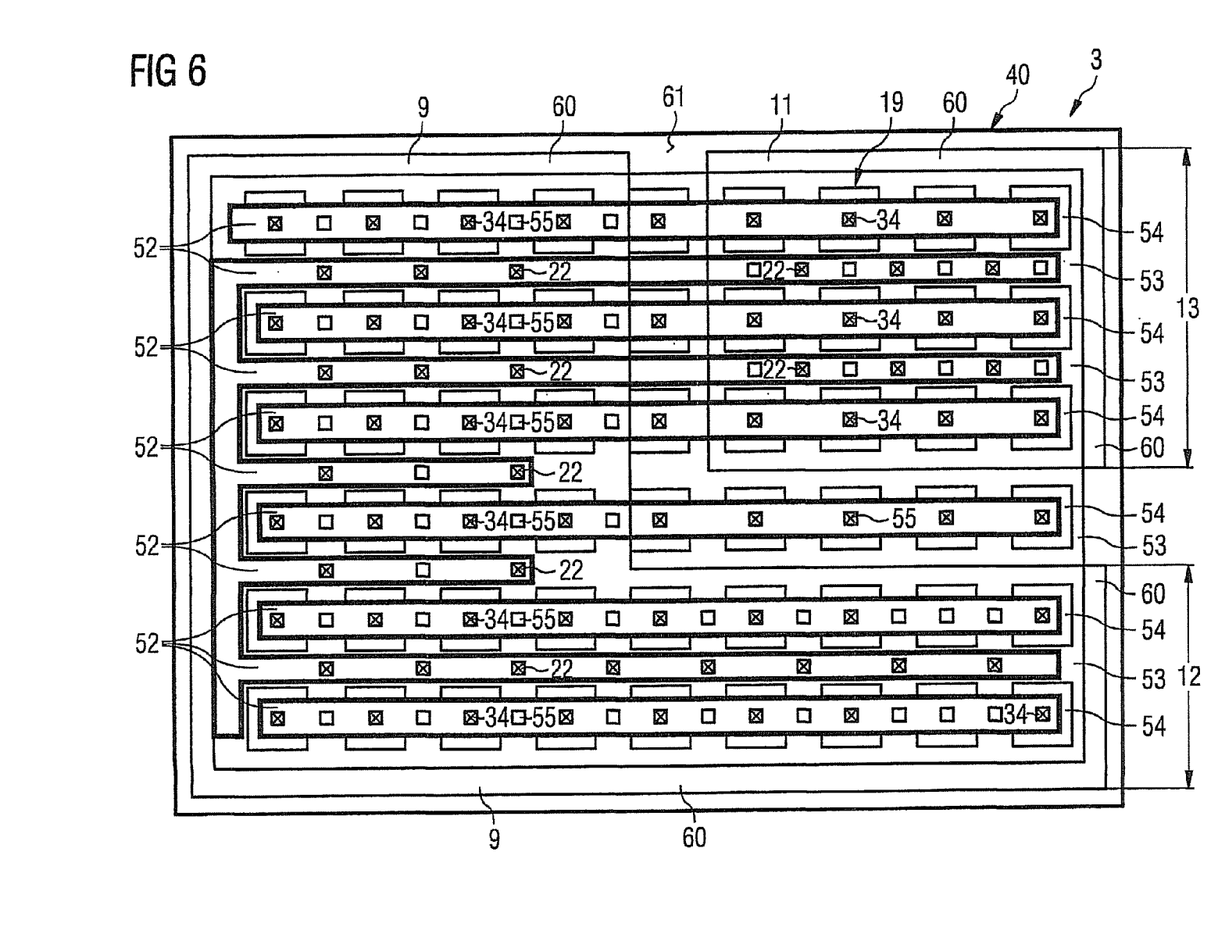
FIG. 6 illustrates a schematic plan view of a semiconductor component of a further embodiment of the invention.

FIG. 6 illustrates a schematic plan view of a semiconductor component 3 of a further embodiment of the invention, which represents a planar DMOS. This plan view illustrates that all the embodiments of the invention are not only restricted to trench transistors as in the previous figures or to strip structures. The plan view in FIG. 6 illustrates only regions of the source and gate contact areas from the planar DMOS. In the regions 54 not covered by gate polysilicon 53, body and source zones are implanted and later outdiffused. The first metallization layer 52 bears on an intermediate metallization that covers the silicon surface or the gate polysilicon 53. Through the contact windows 55, the gate polysilicon is and the source and body zones are connected to the first metallization layer 52. The through contacts 34 in the region of the first component electrode 9 and the through contacts 22 in the region of the component control electrode 11 in turn connect the first metallization 52 to a metallization 60 of the first component electrode 9 and the component control electrode 11. The metallization 60 serves to fix connecting elements (not illustrated here) thereon. One advantage of this structure is that the gate resistance, which is conventionally a few ohms, is now reduced practically to zero.

Figure 7:
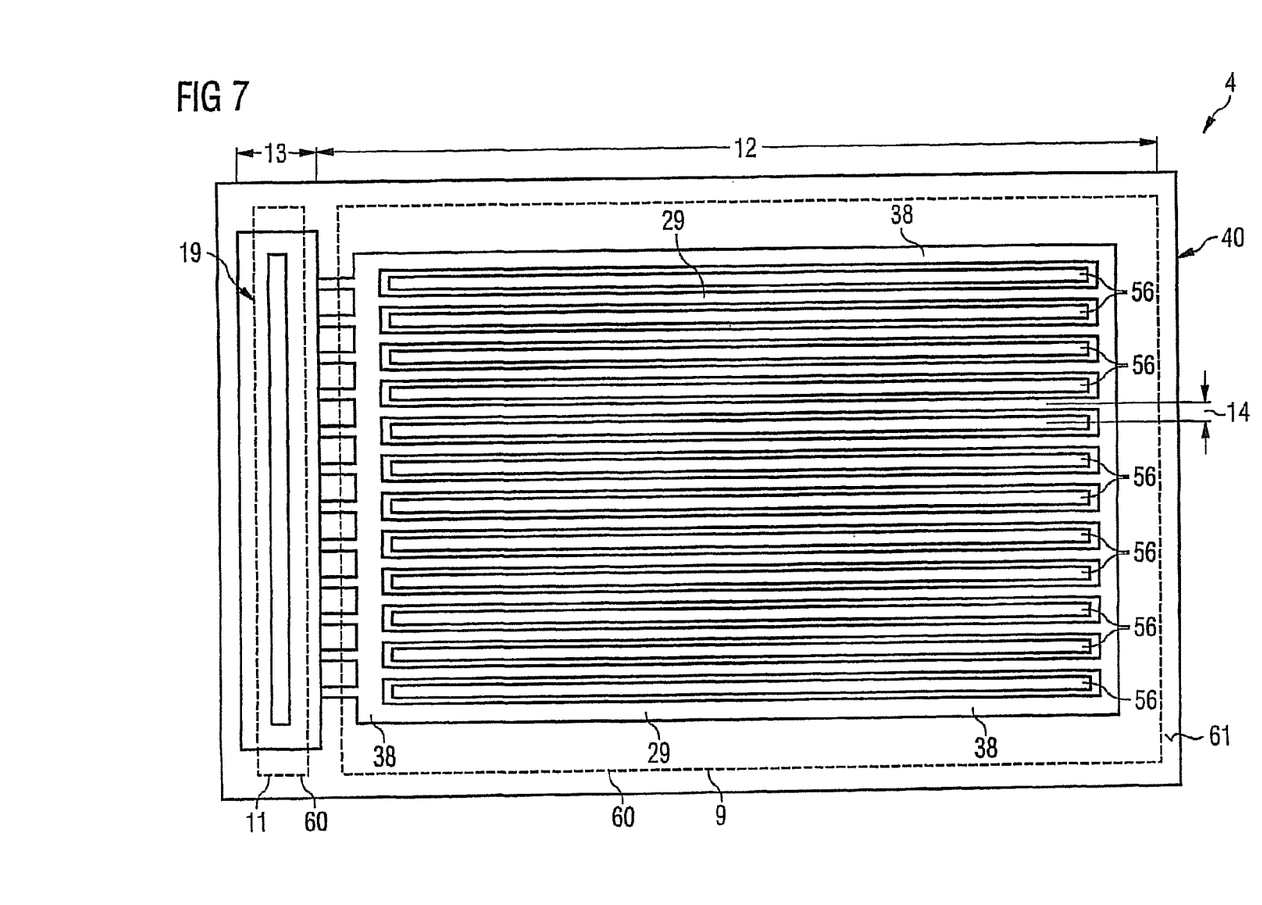
FIG. 7 illustrates a schematic plan view of a semiconductor component of a further embodiment of the invention.

FIG. 7 illustrates a schematic plan view of a semiconductor component 4 of a further embodiment of the invention. In the left-hand partial region, in this case the component control electrode 11 with a metallization 60 is applied, while the first component electrode 9 as source electrode covers an active first cell array 12 over a large area; in this case, the strip-type semiconductor element cells 14 are provided with a trench structure 29 for the cell control electrodes and for a ring line 38. Furthermore, contact strips 56 are arranged in the region of the first component electrode 9, the contour of which is identified by a dashed line, the contact strips being electrically connected to the metallization 60. If a copper clip as source connection is provided as connecting element in the case of a semiconductor component 4 of this type, then a passivation composed of silicon nitrite or polyimide for example, is applied on the metallization 60 and provided with through contact points.

Figure 8:
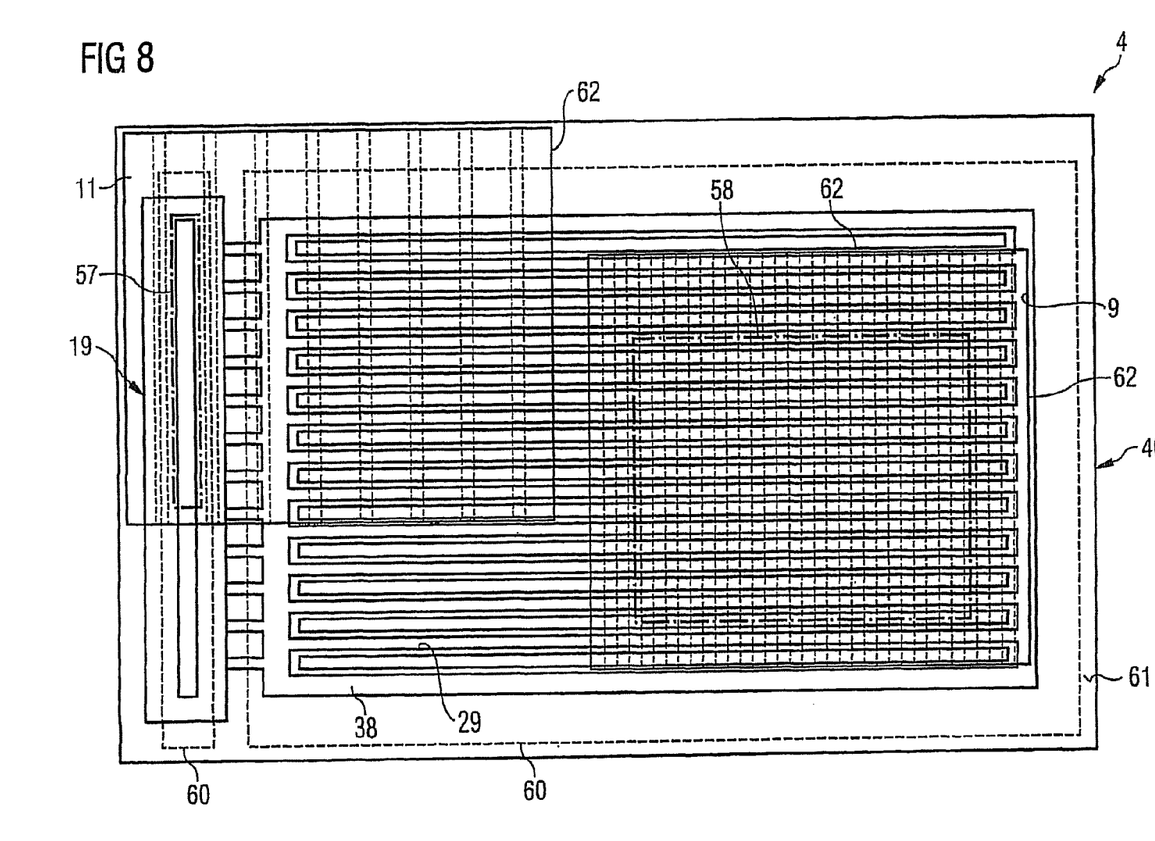
FIG. 8 illustrates a schematic plan view of the semiconductor component in accordance with FIG. 7 after applying a passivation layer and after opening through contact points.

FIG. 8 illustrates a schematic plan view of the semiconductor component 4 in accordance with FIG. 7 after applying a passivation layer and after opening through contact points. For this purpose, FIG. 8 illustrates a passivation region 57 for the component control electrode 11 and a passivation region 58 for the first semiconductor component electrode 9 using dotted lines. A second metallization 62 is subsequently applied to these partially opened passivations 57 and 58 by a "lift-off method", the second metallization being used as a soldering layer for the copper clip that is later to be applied as connecting element.

The second metallization 62 is applied both to the region 57 provided for the component control electrode 11 and to the region 58 provided for the first component electrode 9. For this purpose, in the chip partial region in which the metallization 60 for the component control electrode 11 is arranged, a connection can be led out via a planar polysilicon strip to the passivation region 57 and be electrically connected to a further metal layer on the passivation via the through contact points arranged in the passivation region 57. Consequently, an active cell region of the semiconductor component 4 of this further embodiment of the invention is situated below the region 57 on which the final component control electrode 11 is arranged.

Although specific embodiments have been illustrated and described herein, it will be appreciated by those of ordinary skill in the art that a variety of alternate and/or equivalent implementations may be substituted for the specific embodiments illustrated and described without departing from the scope of the present invention. This application is intended to cover any adaptations or variations of the specific embodiments discussed herein. Therefore, it is intended that this invention be limited only by the claims and the equivalents thereof.

What is claimed is:
1. A method for producing a plurality of semiconductor chips for semiconductor components with cell structures, comprising:
  patterning a semiconductor wafer composed of a monocrystalline semiconductor body with cell structures for MOSFETs, IGBTs or JFETs with a lateral or vertical drift path arranged between a first region of the semiconductor body for a first cell electrode and a second region of the semiconductor body for a second cell electrode, wherein the first region has a surrounding body zone with semiconductor material doped complementarily to the drift path, which body zone can be activated by a cell control electrode in interaction with a component control electrode;
  arranging the cell structures in semiconductor chip positions to form a first active cell array provided below a first component electrode;
  arranging the cell structures in at least one partial region of the semiconductor chip positions to form a second active cell array of the partial region, the array being provided below the component control electrode; and providing a metallization on a first surface of the semiconductor body to form the first component electrode and the component contol electrode.

2. The method of claim 1, wherein arranging the cell structures comprises carrying out a strip-type introduction of trench structures at least for the cell control electrodes both of the first cell array and of a second cell array of the partial region.

3. The method of claim 1, wherein a plurality of cell control electrodes are introduced into the trench structure alongside one another or one below another.

4. The method of claim 1, wherein insulation materials or electrically conductive materials are selectively applied by photolithography.

5. The method of claim 1, wherein an anisotropic etch by a dry reactive ion etch is carried out for introducing trench structures.

6. The method of claim 1, wherein, as insulation interlayer between two metallization structures, one of the insulation materials from the group $SiO_2$, $Si_3N_4$ or polyimide is applied by using PVD or CVD.

7. The method of claim 1, wherein a highly doped electrically conductive polysilicon is deposited for filling the trench structures with a conductive cell control electrode material.

8. The method of claim 1, wherein a deposition of highly doped polysilicon is carried out for selectively depositing cell control electrode connecting lines.

9. The method of claim 1, wherein, as an alternative to producing plated-through holes to the body zones, a process of contact-connecting the body zones to the source zones of a MOSFET cell structure is carried out by sputtering a thin strip-type metallization layer onto the silicon surface of the semiconductor body.

10. The method of claim 1, further comprising providing a second component electrode on a second surface of the of the semiconductor body opposite the first surface.

11. The method of claim 1, wherein the semiconductor components are power transistors.

12. The method of claim 1, further comprising providing charge compensation zones in the drift path, wherein the charge compensation zones are doped complementary to the drift path.

* * * * *